(12) United States Patent
Abadeer et al.

(10) Patent No.: US 6,917,319 B1
(45) Date of Patent: Jul. 12, 2005

(54) DIGITAL TO ANALOG CONVERTER USING TUNNELING CURRENT ELEMENT

(75) Inventors: Wagdi W. Abadeer, Jericho, VT (US); John A. Fifield, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/708,877

(22) Filed: Mar. 30, 2004

(51) Int. Cl.[7] .............................. H03M 1/00; H03M 1/66
(52) U.S. Cl. ..................... 341/133; 341/136; 341/144
(58) Field of Search .......................... 341/144, 83, 133, 341/136; 323/281, 316; 257/105, 25, 14; 365/159; 327/568

(56) References Cited

U.S. PATENT DOCUMENTS

| | | | | |
|---|---|---|---|---|
| 4,064,448 A | * | 12/1977 | Eatock | 323/281 |
| 5,469,163 A | * | 11/1995 | Taddiken | 341/83 |
| 6,118,264 A | * | 9/2000 | Capici | 323/316 |
| 6,424,281 B1 | * | 7/2002 | Liaw et al. | 341/144 |
| 6,664,909 B1 | * | 12/2003 | Hyde et al. | 341/144 |

* cited by examiner

Primary Examiner—Patrick Wamsley
(74) Attorney, Agent, or Firm—McGinn & Gibb, PLLC; Richard A. Henkler, Esq.

(57) ABSTRACT

A method and structure for a digital-to-analog converter comprising a voltage source supply; a voltage division stack connected to the voltage source supply; a multiplexer connected to the voltage division stack; a digital circuit connected to the multiplexer; an analog circuit connected to the multiplexer; and an input binary word source connected to the digital circuit, wherein outputs of the digital circuit are input into the analog circuit and converted as analog output. According to the invention, the multiplexer comprises any of an NFET and/or a PFET. The digital-to-analog converter further comprises a capacitor connected to the analog circuit and a binary-weighted tunneling current device connected to the digital circuit. The multiplexer and the capacitor are made of thick oxide (at least 5 nm thick). The tunneling current device outputs tunneling current, wherein the tunneling current is adjusted in proportion to a binary weight of the input binary word source.

20 Claims, 9 Drawing Sheets

DIGITAL TO ANALOG CONVERTER USING TUNNELING CURRENT ELEMENT

BACKGROUND OF INVENTION

1. Field of the Invention

The invention generally relates to electrical circuit design, and more particularly to a digital-to-analog converter using tunneling current characteristics of a field effect transistor (FET) ultra-thin gate oxide.

2. Description of the Related Art

Analog-to-digital converters convert analog signals such as speech, music, and video and transform it into a digital form, which can be more readily processed by most conventional computers and microprocessors. A typical analog-to-digital converter is the parallel encoder, which utilizes a bank of voltage comparators and a bank of resistors to simultaneously compare an analog input signal to a set of reference voltages.

These devices usually comprise a stable reference voltage and a series of equal resistors, which form a voltage-dividing sequence between the reference voltage and ground. For example, for a 3-bit converter, $2^x$=number of resistors used, where x=3 for a 3-bit converter, thus $2^3$=8 resistors are used. These devices further include a set of voltage comparators, which for the 3-bit converter example would require $2^3 1=$ 7comparators. Also, these devices include an encoder circuit, which reads the comparator outputs (high or low voltage), and produces a 2-bit binary output for each comparator.

Similarly, digital-to-analog converters take a binary input and convert it into an analog form using a stable reference voltage, a connection of resistors referred to as a ladder (for example, an R–2R ladder), a series of FET switches, and operational amplifier output circuitry.

Conventionally, digital-to-analog converters use banks of large resistors to make voltage dividers for each bit of a digital input. The resistors have higher than desired tolerance and require large areas for layout as well as power consumption. Moreover, the conventional digital-to-analog converters are subject to several errors including saturation errors, resolution and quantization errors, and conversion errors.

Therefore, due to the limitations of the conventional devices, there is a need for a novel digital-to-analog converter, which provides an accurate voltage divider and overcomes the drawbacks of the conventional devices.

SUMMARY OF INVENTION

The invention provides a digital-to-analog converter comprising a voltage source supply; a voltage division stack (voltage divider) connected to the voltage source supply; a multiplexer connected to the voltage division stack; a digital circuit (decoder), such as a digital decoder or a NAND device, connected to the multiplexer; an analog circuit, such as an operational amplifier, connected to the multiplexer; and an input binary word source connected to the digital circuit; wherein outputs of the digital circuit are input into the analog circuit and converted as analog output. According to the invention, the multiplexer comprises any of a n-type field effect transistor (NFET), a p-type field effect transistor (PFET), and a combination thereof. The digital-to-analog converter further comprises a capacitor connected to the analog circuit and a binary-weighted tunneling current device connected to the digital circuit. Moreover, the multiplexer and the capacitor comprise an oxide of at least 5 nm in thickness. Furthermore, the tunneling current device outputs tunneling current, wherein the tunneling current is adjusted in proportion to a binary weight of the input binary word source. In another embodiment, the digital-to-analog converter further comprises a node coupled to the digital circuit; at least one current supply FET coupled to the node; and an output FET operable for supplying a current proportional to a current of the current supply FET, wherein the current supply FET is operable for maintaining voltage on the node constant. Additionally, the voltage division stack comprises an NFET transistor in parallel with a tunneling NFET.

Another embodiment of the invention provides a method of converting a digital signal into an analog signal, wherein the method comprises arranging a plurality of NFETs into a voltage division stack; applying a regulated output of voltage to the voltage division stack; applying a binary-weighted input word to a digital circuit; applying a voltage output of the voltage division stack to each of a multiplexer and the digital circuit; generating a digital output from the multiplexer and the digital circuit; inputting the digital output into an analog circuit; and converting the digital output into an analog output. The method further comprises connecting a binary-weighted tunneling current device to the digital circuit, wherein the tunneling current device outputs tunneling current, wherein the tunneling current is adjusted in proportion to a binary weight of the input binary word source, and wherein the voltage division stack comprises an NFET transistor in parallel with a tunneling NFET.

The invention provides a single stack of NFETs properly biased to provide an accurate voltage divider. This tunneling voltage divider is smaller and lower in power than traditional resistor stack voltage references and allows a smaller and lower power digital-to-analog converter to be designed.

Some advantages of this invention are achieved by using small area NFETs in a division stack, instead of using conventional resistors. The minimum required area of the NFETs is determined such that mismatches in threshold voltage and gate tunneling current characteristics between the NFETs are minimized to very low values. The stack of NFETs of ultra-thin gate oxide operates in a gate current tunneling mode and performs the function of voltage division. A significant characteristic of the gate tunneling current is that with all the NFETs having the same area, the same current flows through the FETs when the voltage drop across each gate oxide element is the same. Since the gate tunneling current is proportional to the area of the oxide, power dissipation is kept to a minimum by minimizing the area of each NFET.

These, and other aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
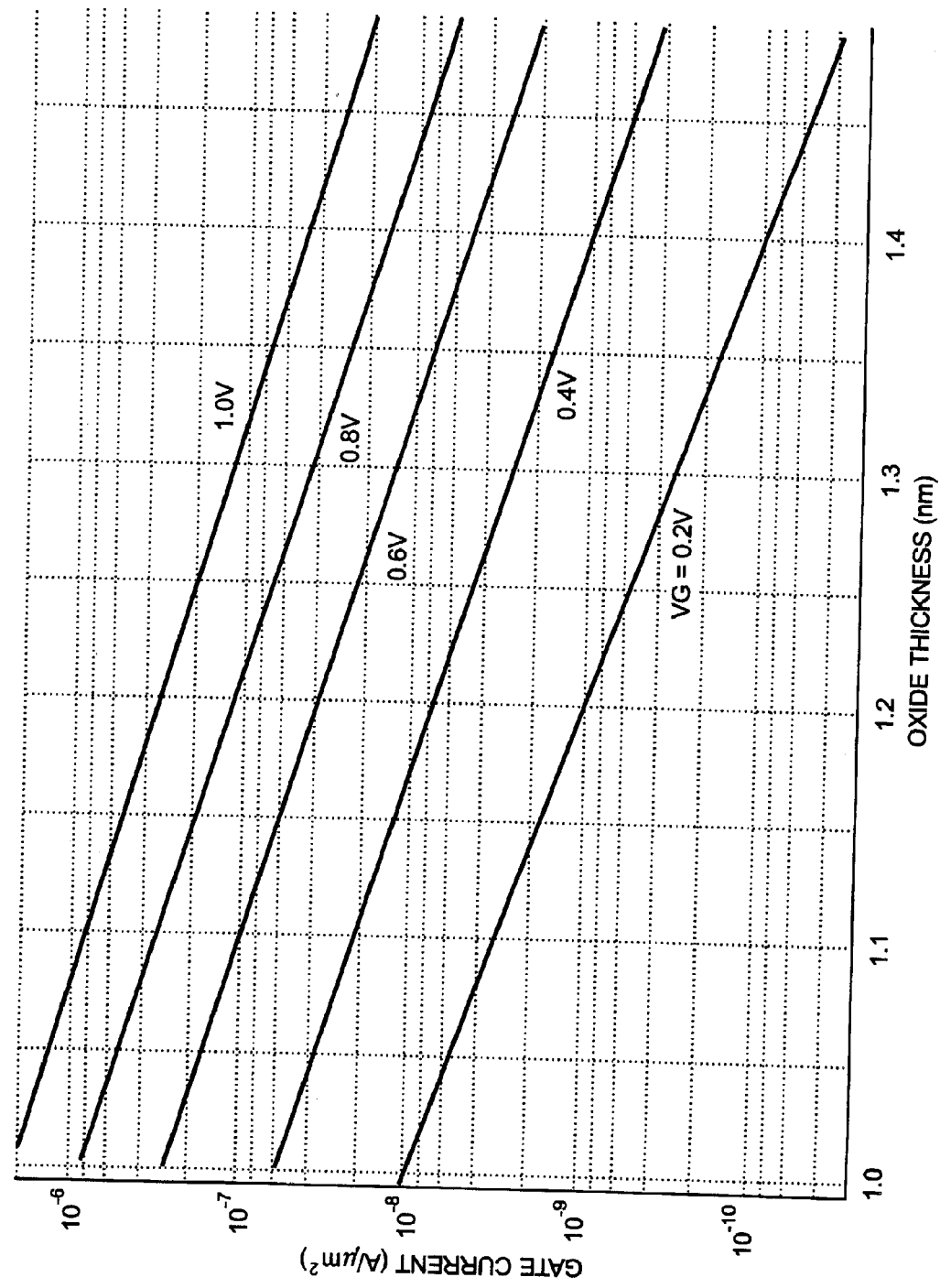
FIG. 1 is a graphical representation illustrating the tunneling current characteristics as a function of oxide thickness for different values of gate voltage according to an embodiment of the invention.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need for a digital-to-analog converter, which provides an accurate voltage divider and overcomes the drawbacks of the conventional devices. Referring now to the drawings, and more particularly to FIGS. 1 through 9, there are shown preferred embodiments of the invention.

Figure 2:
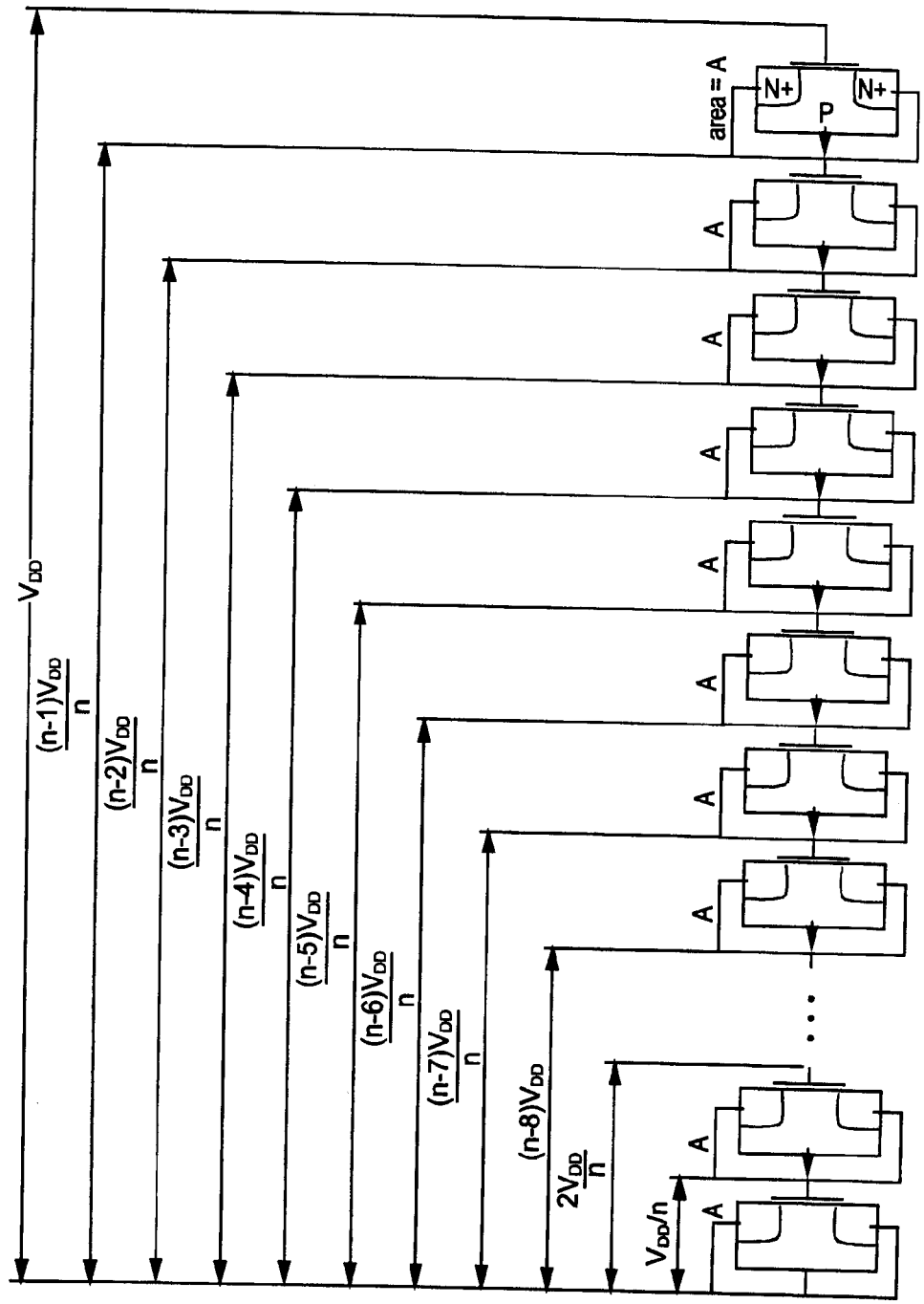
FIG. 2 is a schematic diagram illustrating the voltage divisions according to an embodiment of the invention.
Figure 6:
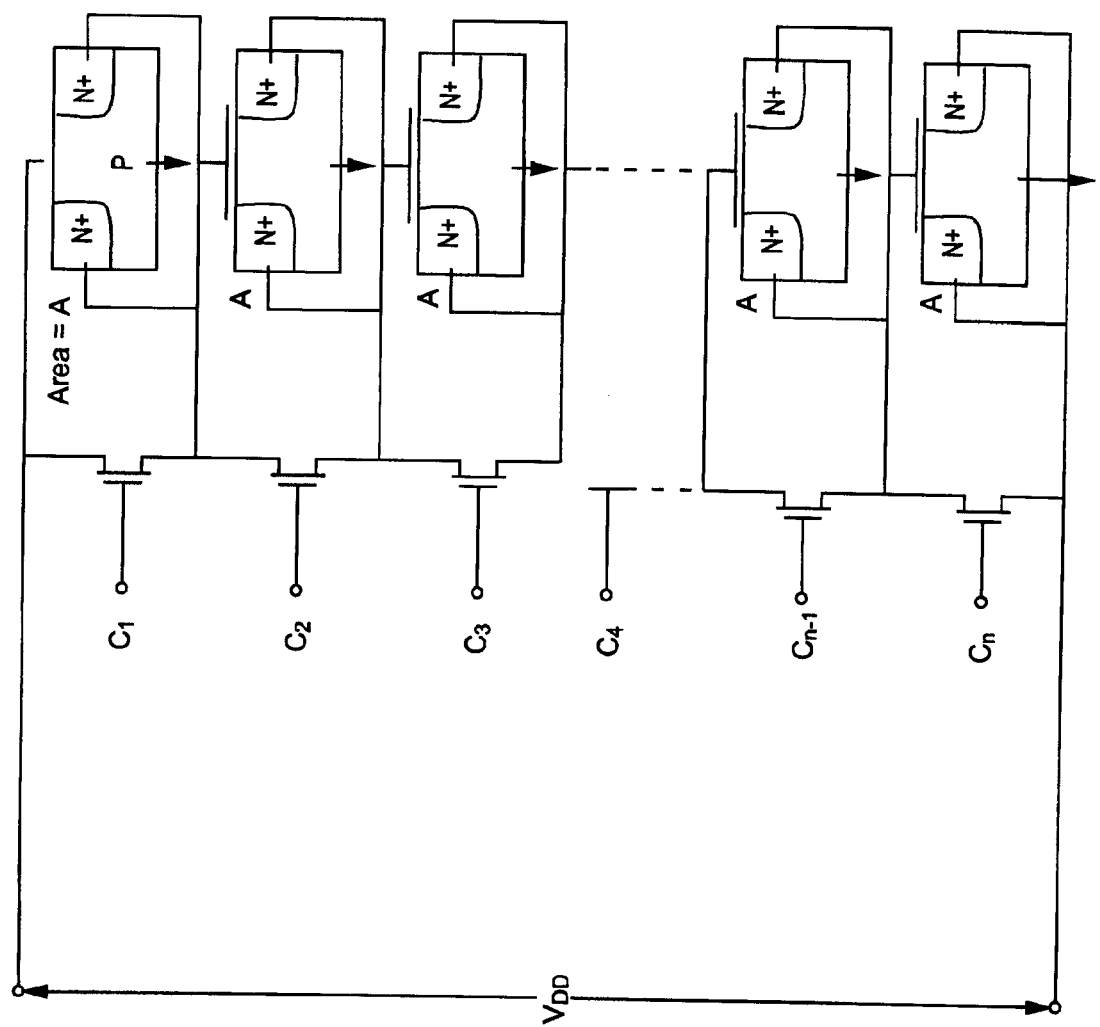
FIG. 6 is a schematic diagram illustrating a voltage division stack according to an embodiment of the invention.

FIG. 1 shows the tunneling current characteristics as a function of oxide thickness for different values of gate voltage. The oxide thickness is defined by an electrical equivalent thickness measurement in the inversion mode. As shown in the graph, as the oxide thickness increases, the gate current decreases for various values of gate voltage (for example, for gate voltages of 0.2 V, 0.4 V, 0.6 V, 0.8 V, and 1.0 V). The characteristics of the gate tunneling current for ultra-thin gate oxides is an essential element that allows voltage division between serially connected FETs in the configuration of a voltage division stack as shown in FIGS. 2 and 6. For FETs with the same gate oxide thickness and equal oxide areas, the gate tunneling currents of the FETs are equal when the voltages applied across the gate oxides are equal. FIG. 2 shows the basic configuration of an embodiment of the invention to create voltage divisions to any degrees as desired. The case shown in FIG. 2 is for a stack of n NFETs all of equal oxide area A, biased in inversion, and connected to a power source of $V_{DD}$. The different voltage levels generated by the stack are: $[(n-1) \times V_{DD}/n]$, $[(n-2) \times V_{DD}/n]$, $[(n-3) \times V_{DD}/n]$, $[(n-4) \times V_{DD}/n]$, $[(n-5) \times V_{DD}/n]$, $[(n-6) \times V_{DD}/n]$, $[(n-7) \times V_{DD}/n]$, $[(n-8) \times V_{DD}/n]$ ... $[4 \times V_{DD}/n]$, $[3 \times V_{DD}/n]$, $[2 \times V_{DD}/n]$, and $[V_{DD}/n]$. The configuration shown in FIG. 2 is intended to demonstrate how the stack of n NFETs could be used to generate several voltage levels depending on the value of n. As such, the invention provides a novel use of tunneling FET elements arranged as a division stack, as provided in FIGS. 2 and 6, in designing a digital-to-analog converter.

The NFETs are made of zero threshold voltage devices, which allow the NFET to be in inversion even at very small gate voltages so that the gate tunneling current is repeatable and predictable based only on the oxide thickness. According to the invention, oxide thickness variations between the devices with close proximity on the same chip are better than 1%. Moreover, the voltage division changes due to temperature variations are less than 3%.

Figure 3:
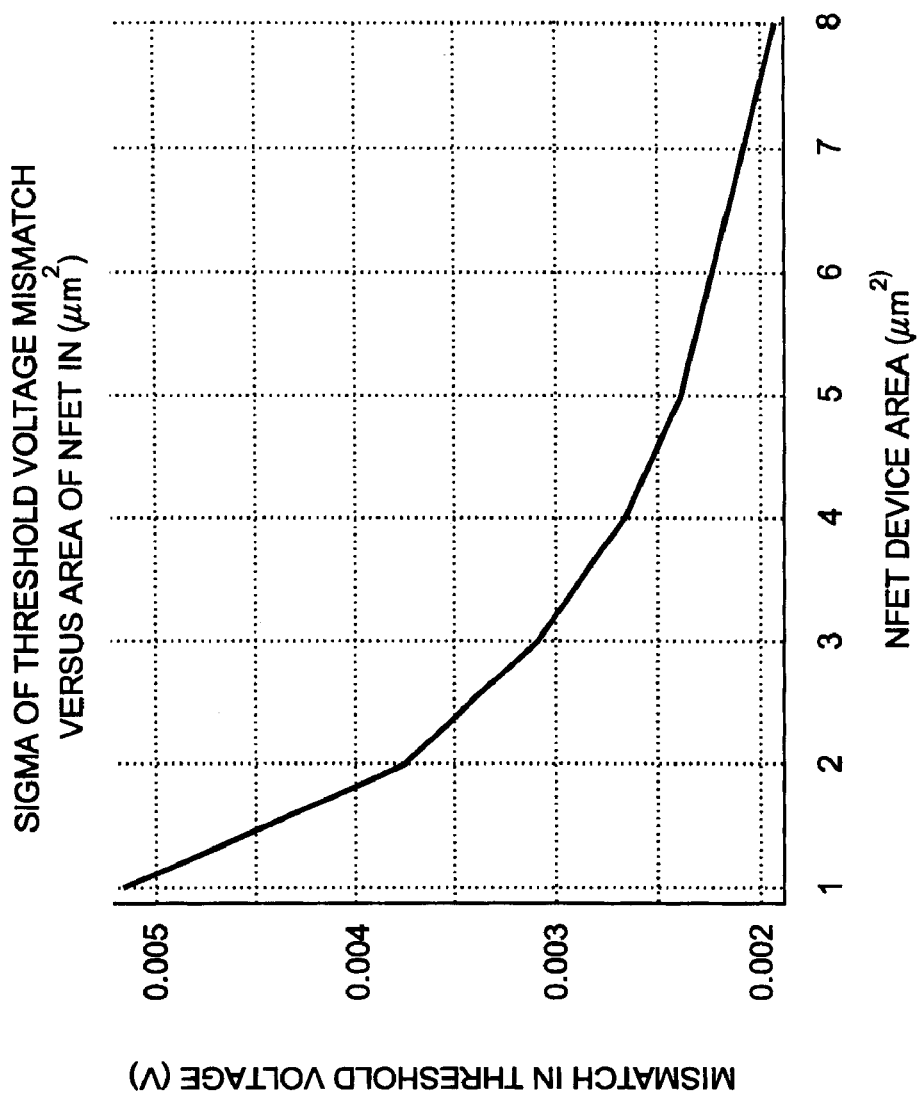
FIG. 3 is a graphical representation illustrating the sigma of threshold voltage mismatch versus NFET device area according to an embodiment of the invention.

The length and width, and hence the area of each FET in the division stack is designed to minimize variations in the gate current due to threshold voltage tolerance and mismatches between the FETs. The appropriate minimum area of the devices is determined as follows for a typical case (as an example) of 1.2 nm physical oxide thickness. FIG. 3 shows the sigma of threshold voltage mismatch between the FETs as a function of the device area. As the device area (length and width) increases, the threshold voltage tolerance and mismatches decreases. This is important in determining a minimum area requirement for the FETs. It should be noted from FIG. 3, that as the area of the FET decreases, the mismatch in the threshold voltage between FETs increases. The threshold voltage of the FET could have an effect on the gate tunneling current in inversion. Thus, it is valuable to determine a minimum area requirement so that the mismatches between the threshold voltages of the FETS, and hence differences in their gate tunneling current characteristics, be negligibly small. From FIG. 3, at a device area of 4 $\mu$m the (3×Sigma) variations in threshold voltage are less than 10 mV.

Figure 4:
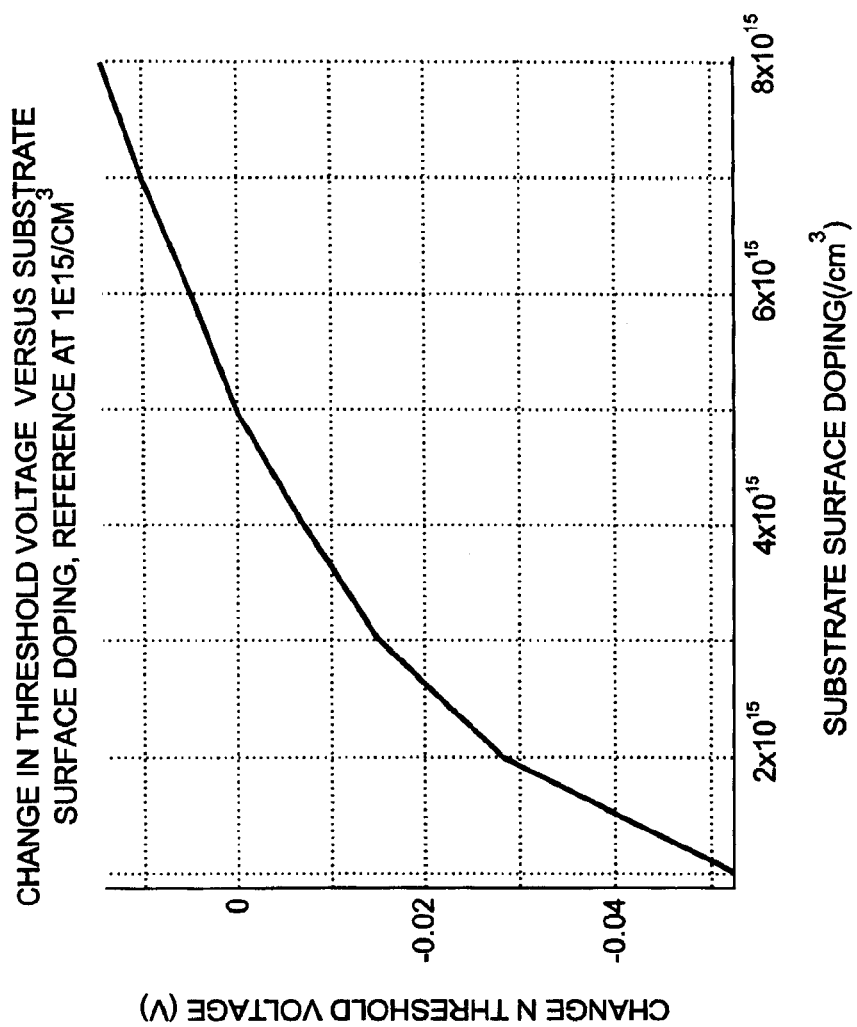
FIG. 4 is a graphical representation illustrating the change in threshold voltage versus substrate doping according to an embodiment of the invention.
Figure 5:
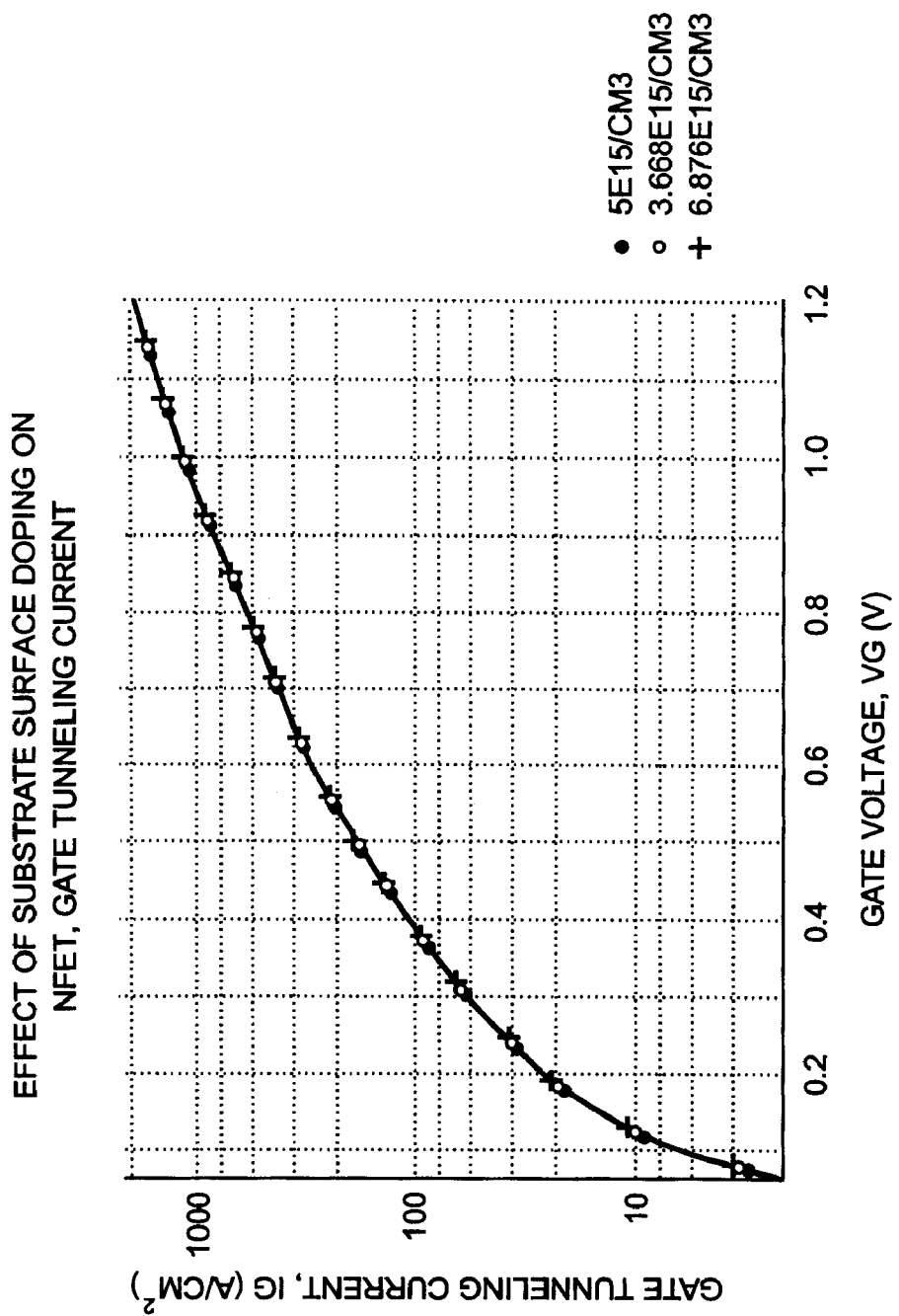
FIG. 5 is a graphical representation illustrating the gate current versus the gate voltage according to an embodiment of the invention.

FIG. 4 shows the change in threshold voltage due to changes in silicon substrate surface doping, where the reference point (no change in Vt) is defined at a doping of 5E15 /cm$^3$. From this result, a change of +/−10 mV in threshold voltage is produced by a change in surface doping from 5E15 to 6.876E15 /cm$^3$ and 3.668E15 /cm$^3$, respectively. Applying this result to the corresponding changes in gate current of the FET, the results are shown in FIG. 5. The results indicate that with a device area of 4 $\mu$m$^2$, the changes and mismatches in threshold voltage between the FETs will result in changes in gate current well below 1%. Thus, the length and width of the FETs are all designed to 2 $\mu$m×2 $\mu$m; i.e. an area of 4 $\mu$m$^2$. This is significant because it is highly desirable to keep the FET device area in the division stack as small as possible, but at the same time minimize threshold voltage mismatches and in turn minimize differences in gate tunneling current characteristics of the FETs. Thus, it is desirable to determine minimum area requirement for the FETs.

The preferred embodiment includes having a band gap reference voltage source for the supply VDD connected to the FET division stack. This will ensure reduction of voltage supply tolerance and variations and will minimize the effect on the voltage division stack.

Another feature of the invention is an additional control to cut off (bypass) any combination of the FETs in the voltage division stack. As shown in FIG. 6, this is accomplished by having an NFET transistor in parallel with each tunneling NFET, whereby control signals $C_1, C_2, C_3, C_4, \ldots C_{n-1}$, and $C_n$ are applied to the gates of the control transistors. When a control gate, for example, $C_n$, is low, the control transistor with that control gate is OFF, and the tunneling NFET in parallel with it is active in the voltage division stack. When the control gate $C_n$ is high, the control transistor if ON and the associated tunneling NFET is cut-off (bypassed) from the voltage division stack. This control allows for changing the voltage division ratios available for digital-to-analog conversion. The control transistors are made of thick oxide (preferably 5 nm or greater gate oxide thickness) instead of ultra-thin gate oxides, such as in conventional devices. This will minimize gate tunneling currents for the control transistors, which may otherwise interfere with the operation of the tunneling NFETs.

Figure 7:
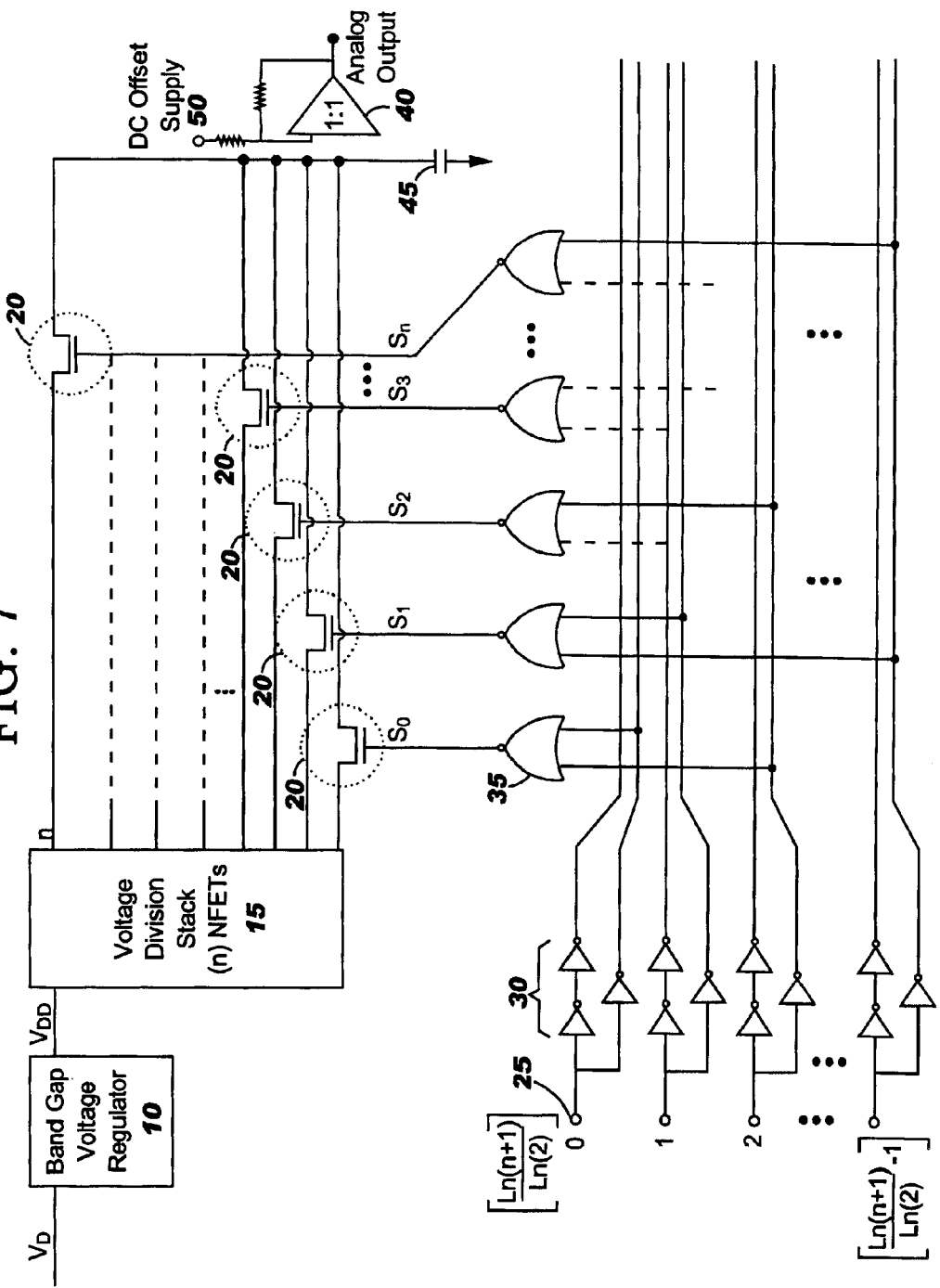
FIG. 7 is a circuit diagram of a digital-to-analog converter according to an embodiment of the invention.

According to an embodiment of the invention, a digital-to-analog converter using tunneling amplifiers is shown in FIG. 7. The system comprises a band gap voltage regulator 10 with input as power supply $V_D$ and a regulated output as $V_{DD}$ which is applied to the NFET voltage division stack 15, which is further described in FIGS. 2 and 6. The outputs of the voltage division stack (n+1) are applied to a multiplexer (MUX) 20 and a [Ln(n+1)/Ln(2)] input word 25 are applied to a digital decoder 30 and the (n+1) outputs are applied to NAND devices 35 which, through control transistors (not shown), feed the (n+1) outputs of the voltage divider stack 15 to an operational amplifier (op amp) 40 with a capacitor 45 connected to its first input and with a DC Offset supply 50 connected to the second input of the operational amplifier 40. The output of the operational amplifier is in analog mode.

Figure 8:
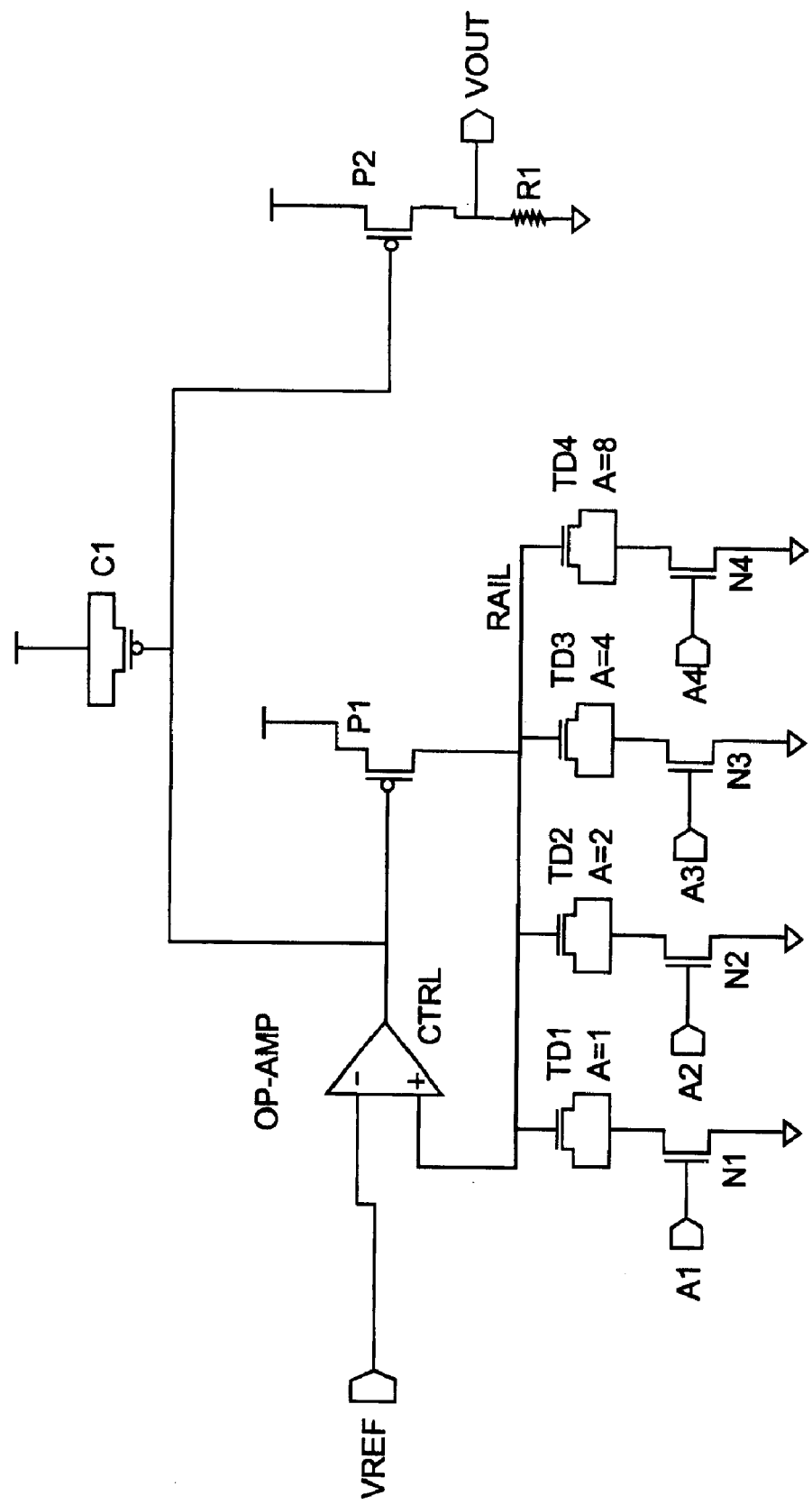
FIG. 8 is a circuit diagram of a digital-to-analog converter using tunneling current according to an embodiment of the invention.

An embodiment using tunneling current to make a fully operable digital-to-analog converter is shown in FIG. 8, whereby a voltage reference is compared to the RAIL node which is being fed by a PFET (P1) device. P1 PFET device is controlled by a unity gain op-amp to provide enough current to supply adequate tunneling current to make the RAIL voltage equal to $V_{REF}$. Digital switch devices and binary-weighted tunneling devices are connected to the RAIL node. The tunneling current is increased or decreased in proportion to the weight of the input binary word ($A_0$–$A_n$). The current through the first PFET (P1) is mirrored to a second PFET (P2) and is directed to node $V_{out}$. Analog output can be in current form or by the addition of the resistor, wherein a voltage output is available. Experimentally, results are highly linear and the current consumption in the tunneling D-A conversion is less than 400 na.

FIG. 8 illustrates an alternate embodiment of a digital-to-analog converter using tunneling devices TD1–TD4. Digital inputs A1–A4 are converted to an analog output signal VOUT. A reference voltage of approximately half of the power supply voltage is applied to the VREF input. This voltage is compared to the voltage on the RAIL node by the OP-AMP. A control voltage CTRL is generated by the OP-AMP which will allow sufficient conduction through PFET P1 to make node voltage RAIL essentially equal to voltage VREF by means of negative feedback. Control voltage CTRL is filtered by decoupling capacitor C1 and is connected to the gate of mirror device P2 which conducts a proportional current into resistor R1.

The current through P1 is modulated in predictable and linear increments by the digital states of control inputs A1–A4. Switch devices N1–N4 are made large enough such that they function as digital switches and allow gating of current through their respective tunneling devices TD1–TD4 to ground. With the voltage on node RAIL held constant by the OP-AMP, the current through P1, and hence, P2 can be modulated in binary increments by designing the tunneling devices TD1–TD4 to have tunneling currents which increase by binary weighting. This is most easily done by designing their thin-oxide areas "A" to increase by binary weighting. An analog output voltage VOUT is developed across resistor R1 in response to the current through P2. If an analog current output is desired, resistor R1 could be omitted.

In other words, the circuit shown in FIG. 8 draws current from a regulated node and then mirrors this current by multiple amounts as analog output. The currents are drawn by a group of tunneling devices TD1–TD4 that are binary increments.

Figure 9:
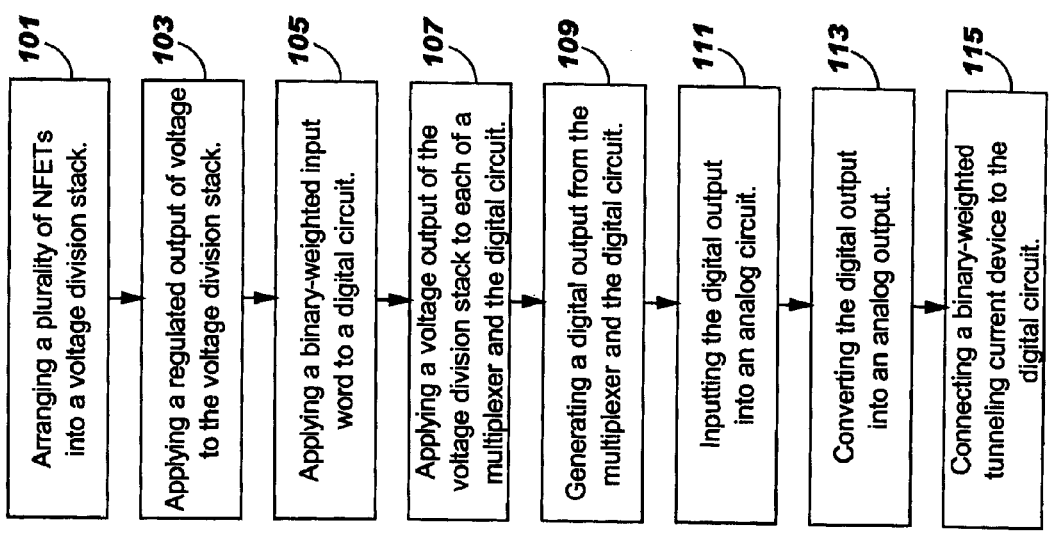
FIG. 9 is a flow diagram illustrating a preferred method of an embodiment of the invention.

According to the flow diagram in FIG. 9, an embodiment of the invention provides a method of converting a digital signal into an analog signal is illustrated, wherein the method comprises arranging 101 a plurality of NFETs into a voltage division stack; applying 103 a regulated output of voltage to the voltage division stack; applying 105 a binary-weighted input word to a digital circuit; applying 107 a voltage output of the voltage division stack to each of a multiplexer and the digital circuit; generating 109 a digital output from the multiplexer and the digital circuit; inputting 111 the digital output into an analog circuit; and converting 113 the digital output into an analog output. The method further comprises connecting 115 a binary-weighted tunneling current device to the digital circuit, wherein the tunneling current device outputs tunneling current, wherein the tunneling current is adjusted in proportion to a binary weight of the input binary word source, and wherein the voltage division stack comprises an NFET transistor in parallel with a tunneling NFET. As mentioned, the multiplexer comprises any of an NFET, a PFET, and a combination thereof. Moreover, the multiplexer and the capacitor comprise an oxide of at least 5 nm in thickness.

According to the invention, a highly linear low current digital-to-analog converter is provided with very small devices as compared to conventional converters using resistors. Generally, the invention provides a circuit which uses smaller tunneling capacitor structures that are used to provide the required voltage references with better tolerance, and better temperature coefficients. As such, the invention provides a single stack of NFETs properly biased to provide an accurate voltage divider. This tunneling voltage divider is smaller and lower in power than traditional resistor stack voltage references and allows a smaller and lower power digital-to-analog converter to be designed.

Some advantages of the invention are achieved by using small area NFETs in a division stack, instead of using conventional resistors. The minimum required area of the NFETs is determined such that mismatches in threshold voltage and gate tunneling current characteristics between the NFETs are minimized to very low values. The stack of NFETs of ultra-thin gate oxide operates in a gate current tunneling mode and performs the function of voltage division. A significant characteristic of the gate tunneling current is that, with all the NFETs having the same area, the same current flows through the FETs when the voltage drop across each gate oxide element is the same. Since the gate tunneling current is proportional to the area of the oxide, power dissipation is kept to a minimum by minimizing the area of each NFET.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A digital-to-analog converter comprising:
    a band gap voltage regulator;
    a voltage divider comprising a plurality of tunneling n-type field effect transistors (NFETs) connected to said band gap voltage regulator;
    a multiplexer connected to said voltage divider;
    a digital decoder connected to said multiplexer;
    an operational amplifier connected to said multiplexer; and
    an input binary word component connected to said digital decoder;
    wherein outputs of said digital decoder are input into said operational amplifier and converted as analog output.

2. The digital-to-analog converter of claim 1, further comprising a capacitor connected to said operational amplifier.

3. The digital-to-analog converter of claim 2, wherein said multiplexer and said capacitor comprise an oxide of at least 5 nm in thickness.

4. The digital-to-analog converter of claim 1, further comprising a binary-weighted tunneling current device connected to said digital decoder.

5. The digital-to-analog converter of claim 4, wherein said tunneling current device outputs tunneling current, wherein said tunneling current is adjusted in proportion to a binary weight of said input binary word component.

6. The digital-to-analog converter of claim 4, further comprising:
    a node coupled to said digital decoder;
    at least one current supply field effect transistor (FET) coupled to said node; and
    an output FET operable for supplying a current proportional to a current of said current supply FET;
    wherein said current supply FET is operable for maintaining voltage on said node constant.

7. The digital-to-analog converter of claim 1, wherein said multiplexer comprises any of a NFET, a p-type field effect transistor (PFET), and a combination thereof.

8. The digital-to-analog converter of claim 1, wherein said voltage divider comprises a NFET in parallel with each said tunneling NFET.

9. A digital-to-analog converter comprising:
    a voltage source supply;
    a voltage division stack connected to said voltage source supply;
    a multiplexer connected to said voltage division stack;
    a digital circuit connected to said multiplexer;
    an analog circuit connected to said multiplexer; and
    an input binary word source connected to said digital circuit;
    wherein outputs of said digital circuit are input into said analog circuit and converted as analog output.

10. The digital-to-analog converter of claim 9, further comprising a capacitor connected to said analog circuit.

11. The digital-to-analog converter of claim 10, wherein said multiplexer and said capacitor comprise an oxide of at least 5 nm in thickness.

12. The digital-to-analog converter of claim 9, further comprising a binary-weighted tunneling current device connected to said digital circuit.

13. The digital-to-analog converter of claim 12, further comprising:
    a node coupled to said digital circuit;
    at least one current supply field effect transistor (FET) coupled to said node; and
    an output FET operable for supplying a current proportional to a current of said current supply FET;
    wherein said current supply FET is operable for maintaining voltage on said node constant.

14. The digital-to-analog converter of claim 12, wherein said tunneling current device outputs tunneling current, wherein said tunneling current is adjusted in proportion to a binary weight of said input binary word source.

15. The digital-to-analog converter of claim 9, wherein said multiplexer comprises any of a n-type field effect transistor (NFET), a p-type field effect transistor (PFET), and a combination thereof.

16. The digital-to-analog converter of claim 9, wherein said voltage division stack comprises an NFET transistor in parallel with a tunneling NFET.

17. The digital-to-analog converter of claim 9, wherein said digital circuit comprises a NAND device.

18. The digital-to-analog converter of claim 9, wherein said analog circuit comprises an operational amplifier.

19. A method of converting a digital signal into an analog signal, said method comprising:
    arranging a plurality of n-type field effect transistors (NFETs) into a voltage division stack;
    applying a regulated output of voltage to said voltage division stack;
    applying a binary-weighted input word to a digital circuit;
    applying a voltage output of said voltage division stack to each of a multiplexer and said digital circuit;
    generating a digital output from said multiplexer and said digital circuit;
    inputting said digital output into an analog circuit; and
    converting said digital output into an analog output.

20. The method of claim 19, further comprising connecting a binary-weighted tunneling current device to said digital circuit, wherein said tunneling current device outputs tunneling current, wherein said tunneling current is adjusted in proportion to a binary weight of said input binary word source.

* * * * *